United States Patent [19]

Kuriki et al.

[11] Patent Number: 4,755,961
[45] Date of Patent: Jul. 5, 1988

[54] DIGITAL TANK CIRCUIT

[75] Inventors: Satoshi Kuriki; Kenji Nakayama, both of Tokyo, Japan

[73] Assignee: NEC Corporation, Tokyo, Japan

[21] Appl. No.: 772,537

[22] Filed: Sep. 4, 1985

[30] Foreign Application Priority Data

Sep. 4, 1984 [JP] Japan .................. 59-184791
Dec. 26, 1984 [JP] Japan .................. 59-273114

[51] Int. Cl.⁴ ............................................. G06F 7/38
[52] U.S. Cl. .................................... 364/724; 364/745
[58] Field of Search ...................... 364/724, 745, 825; 333/166; 324/77 D, 77 E; 358/36

[56] References Cited

U.S. PATENT DOCUMENTS

| | | | |
|---|---|---|---|
| 3,599,108 | 8/1981 | Gardner | 333/166 |
| 3,798,560 | 3/1974 | Taylor | 364/724 |
| 4,034,196 | 7/1977 | Butterweck et al. | 364/745 |
| 4,317,092 | 2/1982 | Potter | 364/724 |
| 4,326,261 | 4/1982 | Peoples | 364/724 |
| 4,356,558 | 10/1982 | Owen et al. | 364/724 |
| 4,569,030 | 2/1986 | Butterweck et al. | 364/724 |
| 4,573,135 | 2/1986 | Dieterich | 364/724 |
| 4,584,600 | 4/1986 | Baker | 364/724 |

OTHER PUBLICATIONS

Peled et al., "A New Hardware Realization of Digital Filters"; IEEE Trans. Acoustics, Speech And Signal Processing, ASSP-22 (6) pp. 456–462; Dec. 1974.

Primary Examiner—Gary V. Harkcom
Assistant Examiner—Tan V. Mai
Attorney, Agent, or Firm—Sughrue, Mion, Zinn, Macpeak & Seas

[57] ABSTRACT

A digital tank circuit, having a center frequency $f_0$, which includes a circuit that samples an analog input signal at a predetermined sampling interval and converts the sampled signal into a binary code as well as a digital filter that is responsive to the binary code and has a gain characteristic with a sharp peak at the center frequency. The digital filter is implemented without multipliers to provide a transfer function given by $$H(z) = 2l \frac{1 - z^{-2}}{1 + (1 - 2^{-n}) z^{-2}}$$

where (l) is an integer and (n) is the number of bits in the code representing each sample. Provision also is made to cancel rounding off errors generated on the filter.

3 Claims, 7 Drawing Sheets

TRANSMITTED DATA    1    1    0    1

FIG. 5A    SIGNAL i

FIG. 5B    SIGNAL o

FIG. 5C    SIGNAL o'

FIG. 5D    SIGNAL c

FIG. 5E    SIGNAL c'

FIG. 5F    SIGNAL d

FIG. 5G    SIGNAL e

FIG. 5H    SIGNAL f

FIG. 5I    SIGNAL g

FIG. 5J    SIGNAL h

FIG. 5K    SIGNAL j

FIG. 5L    SIGNAL b

| $Q_0$ | $Q_1$ | $Q_2$ | $D_0$ | $D_1$ | $D_2$ | $D_3$ | $D_4$ | $D_5$ | Y |
|---|---|---|---|---|---|---|---|---|---|
| 0 | 0 | 0 | 0 | X | X | X | X | X | 0 |
| 0 | 0 | 0 | 1 | X | X | X | X | X | 1 |
| 0 | 0 | 1 | X | 0 | X | X | X | X | 0 |
| 0 | 0 | 1 | X | 1 | X | X | X | X | 1 |
| 0 | 1 | 0 | X | X | 0 | X | X | X | 0 |
| 0 | 1 | 0 | X | X | 1 | X | X | X | 1 |
| 1 | 0 | 0 | X | X | X | 0 | X | X | 0 |
| 1 | 0 | 0 | X | X | X | 1 | X | X | 1 |
| 1 | 0 | 1 | X | X | X | X | 0 | X | 0 |
| 1 | 0 | 1 | X | X | X | X | 1 | X | 1 |
| 1 | 1 | 0 | X | X | X | X | X | 0 | 0 |
| 1 | 1 | 0 | X | X | X | X | X | 1 | 1 |

FIG. 7B

DIGITAL TANK CIRCUIT

BACKGROUND OF THE INVENTION

The present invention relates to a digital tank circuit for use in such a circuit as a timing extractor for extracting timing information from an input signal.

A prior art digital tank circuit comprises sampling/converting means for sampling an analog signal at predetermined intervals of time and converting sampled values into corresponding predetermined binary codes, and a digital filter including adders, multipliers and delay elements. An example of such a digital filter is disclosed in a paper entitled "A New Hardware Realization of Digital Filters" by A. Peled and B. Liu, published in the IEEE Transactions ON ACOUSTICS, SPEECH AND SIGNAL PROCESSING, ASSP-22 (6), pages 456 to 462, December 1974. Since the prior art filter requires at least four complicated multipliers, its manufacturing cost becomes high. Also, with respect to the gain characteristic of the digital filter to be used in the tank circuit, the sharper the peak at the center frequency, the more the influence of roundoff errors produced at the multipliers may not be considered negligible.

One object of the invention is, therefore, to provide a digital tank circuit without using multipliers free from the above-mentioned disadvantages in the prior art circuit.

SUMMARY OF THE INVENTION

According to an aspect of the invention, there is provided a digital tank circuit having a center frequency of $f_0$, which includes a circuit for sampling an input signal at a predetermined sampling interval of time $T_s$ equal to $\frac{1}{4} f_0$ and converting sampled values into corresponding predetermined binary codes, each consisting of a predetermined number of bits (n); and filter responsive to said binary code and operating without multiplier circuits for providing a transfer function given by $$H(z) = 2l \frac{1 - z^{-2}}{1 + (1 - 2^{-n}) z^{-2}}$$

where l is an integer.

BRIEF DESCRIPTION OF THE DRAWINGS

Other features and advantages of the invention will be made more apparent from the following description when taken in conjunction with the accompanying drawings in which.

In these drawings, the same reference numerals represent the same structural elements.

DESCRIPTION OF THE PREFERRED EMBODIMENTS

Description will be made on the embodiments of the invention in detail hereinafter.

Figure 3:
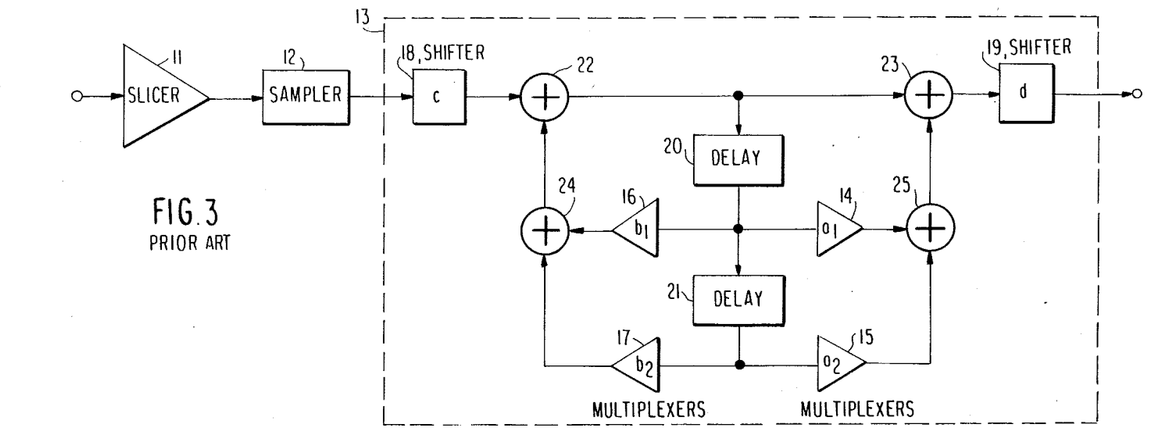
FIG. 3 is a block diagram of a prior art digital tank circuit.

Referring to FIG. 3, a prior art digital tank circuit comprises a slicer 11, a sampler 12 and a digital filter 13. An input signal (i) is converted into a signal (a) that contains a large number of components, having a frequency $f_0$, to be extracted. The converted signal (a) is applied as a high frequency analog signal to the slicer 11. The conversion is performed by a full-wave rectifier when the input signal (i) is a bipolar signal and by a circuit cascade-connected with a differential circuit and a full-wave rectifier when the input signal (i) is an NRZ (non-return-to-zero) signal.

The high frequency analog signal (a) thus obtained is sliced by the slicer 11, sampled by the sampler 12 at a sampling interval $T_s$ (where $T_s = 1/\text{sampling frequency}$ $f_s$) and supplied to the digital filter 13. The digital filter 13 comprises multipliers 14, 15, 16, and 17 whose multiplication coefficients are $a_1$, $a_2$, $b_1$ and $b_2$, respectively; shifters 18 and 19 performing c-bit shift (c is a positive integer) and d-bit shift (d is a positive integer), respectively; delay elements 20 and 21 delaying by one sampling interval $T_s$; and adders 22, 23, 24 and 25. In the prior art tank circuit, the multiplication coefficients of the four multipliers are selected so that the gain characteristic of the filter 13 has a sharp peak at the center frequency $f_0$. The prior art tank circuit with such a construction has the above-mentioned disadvantages.

Figure 1:
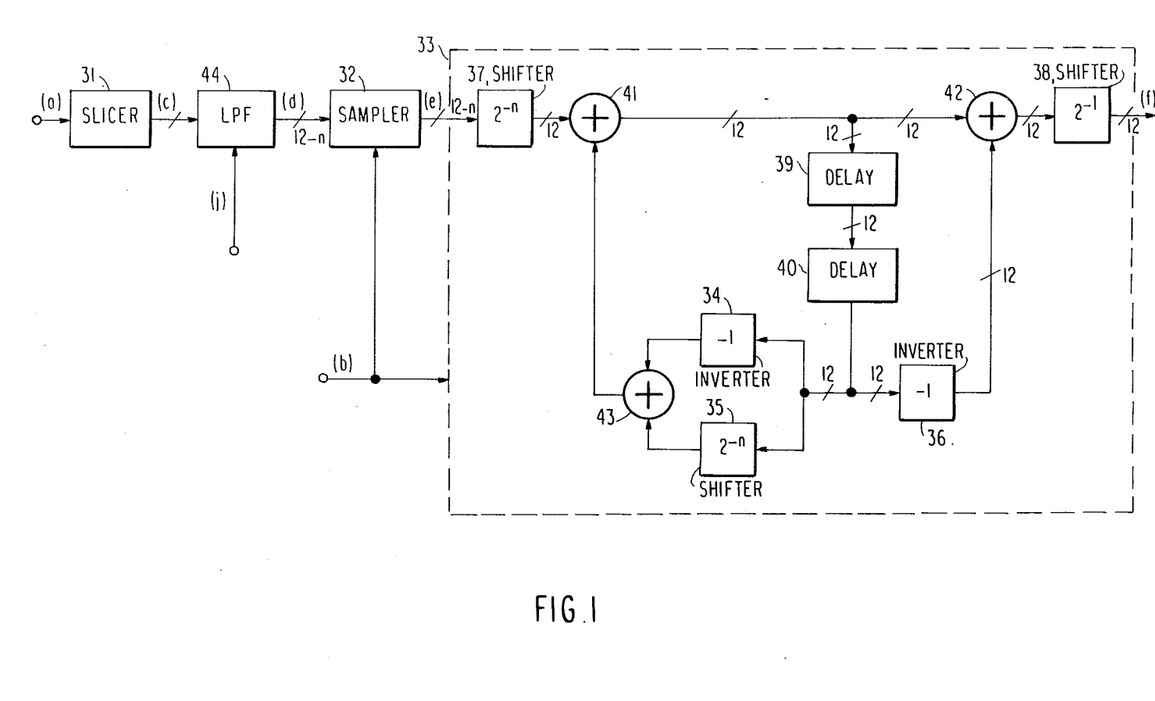
FIG. 1 is a block diagram of a first embodiment of the invention.

Referring to FIG. 1, a first embodiment of the invention comprises a slicer 31, which receives the high frequency analog signal (a) obtained by the above-mentioned conversion of the input signal (i), slices the signal (a) and outputs a sliced signal (c), to a low-pass filter 44. A sampler 32 samples the output signal from the filter 44 at an interval (of time) $T_s (= 1/f_s)$, and delivers the signal to a digital filter 33 in the form of a (12−n) bit code (e), where n is a positive integer. The digital filter 33 is composed of a shifter 37 for receiving the signal from the sampler 32 and shifting the code (e) by n bits to the right to output the shifted code as a first 12-bit code. The filter 33 further includes adders 41 and 42. The adder 41 has a first set of 12 input terminals, each adapted to receive a respective one of the bits of the first code and a second set of 12 input terminals. Adder 41 adds the code applied to the first set of input terminals and a twelve bit code applied to the second set of the input terminals to produce a second 12-bit code. Similarly, the adder 42 has a first set of 12 input terminals, each adapted to receive a respective one of the bits of the second code and a second set of 12 input terminals. Adder 42 adds the code applied to the first set of input terminals and a twelve bit code applied to the second set of the input terminals to produce a third 12-bit code. The filter 33 further comprises delay elements 39 and 40, inverters 34 and 36, shifters 35 and 38, and an adder 43. The delay element 39 produces the second code as a fourth 12-bit code after holding the second code by a time period equal to the sampling interval $T_s$. The delay element 40 yields a fifth 12-bit code after holding the fourth code by a time period to the sampling interval $T_s$. The inverter 34 inverts each bit of the fifth code to yield a sixth 12-bit code. The shifter 35 shifts the fifth code by n bits to the right to produce the shifted code as a seventh 12-bit code. The adder 43 adds the sixth and seventh codes to supply the addition result as a eighth 12-bit code to the second set of the input terminals of the adder 41. The inverter 36 inverts each bit of the fifth code to supply the inverted code as a ninth 12-bit code to the second set of input terminals of the adder 43. The shifter 38 shifts the third code by one bit to the right to output the shifted code as a 12-bit output code (f) of the digital filter 33. In the embodiment, the sampling frequency $f_s$ is selected to be four times the center frequency $f_0$ of the digital filter 33. All the codes are represented in twos complement form.

The transfer function H(z) of the second order infinite impulse response (IIR) filter, based on the configuration of the prior art digital filter 13 shown in FIG. 3, is expressed as $$H(z) = h_0 \frac{1 + a_1 z^{-1} + a_2 z^{-2}}{1 - b_1 z^{-1} - b_2 z^{-2}}$$

In the prior art circuit, the sampling frequency $f_s$ also is selected to be four times of the center frequency $f_0$ of the tank circuit. Thus, the multiplication coefficient $b_1$ becomes 0. Also, since two single zeros are located at frequencies 0 and $f_s/2$ ($2f_0$), respectively, the multiplication coefficient $a_1$ becomes 0, and the coefficient $a_2$ is equal to $-1$. Further, $h_0$ is selected to equal $2^{-n-1}$ and $b_2$ is approximated by $-1 + 2^{-n}$. Consequently, the transfer function (Hz) becomes $$H(z) = 2^{-n-1} \frac{1 - z^{-2}}{1 + (1 - 2^{-n}) z^{-2}}$$

The configuration of the digital filter 33 realizes the above-mentioned transfer function. The operation of "$-1 + 2^{-n}$" in the denominator of the above-mentioned equation is performed by the inverter 34 and the shifter 35. The operation of $-1$ in the numerator is performed by the inverter 36, and the operation of $2^{-n-1}$ by the shifters 37 and 38.

Figure 4A:
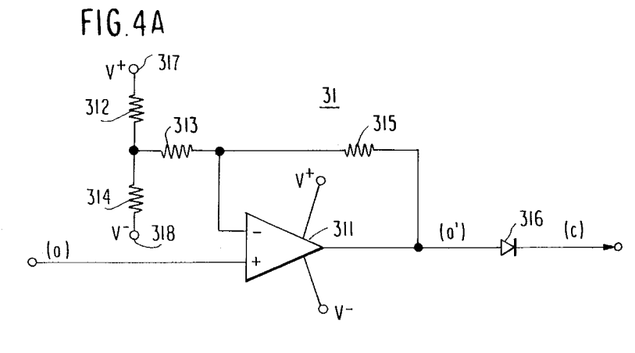
FIGS. 4A to FIGS. 4D are diagrams for showing main parts of the first and second embodiments.
Figures 5A, 5B:
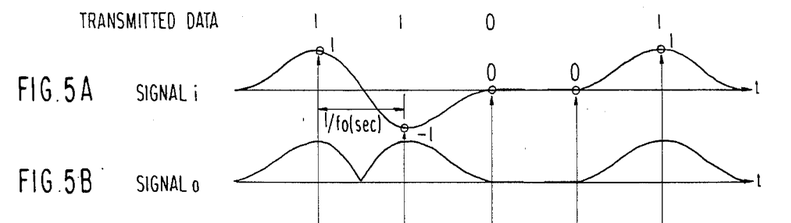
FIGS. 5A to 5L shows waveforms of parts of the first and second embodiments.
Figure 5C:
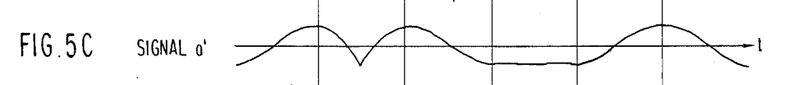
Figure 5D:
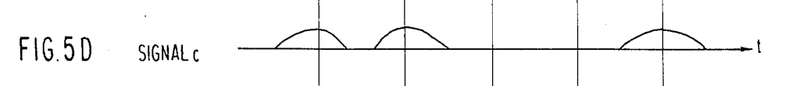

Referring to FIG. 4A, the slicer 31 consists of an operation amplifier 311, resistors 312 through 315 and a diode 316. The resulting signal (a) (FIG. 5B) obtained by rectifying the input bipolar signal (i) (FIG. 5A) is applied to a non-inversion input terminal of the amplifier 311, which outputs a signal (a') (FIG. 5C) expressed as $$a' = \left(1 + \frac{R_d}{R_c}\right) \cdot a + \frac{R_d}{R_c} \cdot \frac{R_a - R_b}{R_a + R_b} \cdot V$$

where $R_a$, $R_b$, $R_c$ and $R_d$ are resistance values of the resisters 312, 314, 313 and 315, respectively. The terminals 317 and 318 are supplied with voltages $+V$ and $-V$, respectively. The signal (a') is affected by the diode 316 with the removal of its negative portion to be changed into the signal (c) shown in FIG. 5D.

Figure 4B:
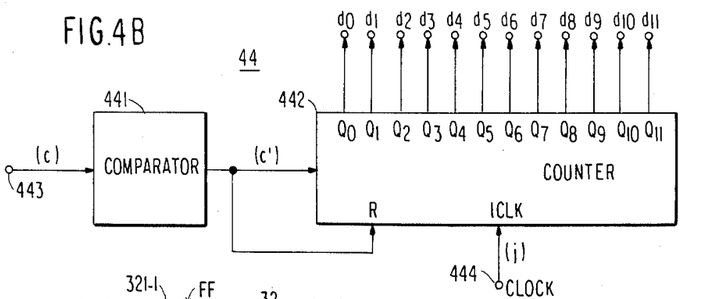
Figure 5E:
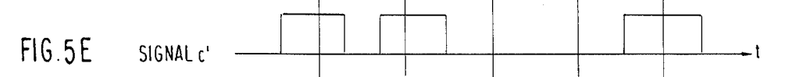
Figures 5F, 5G:
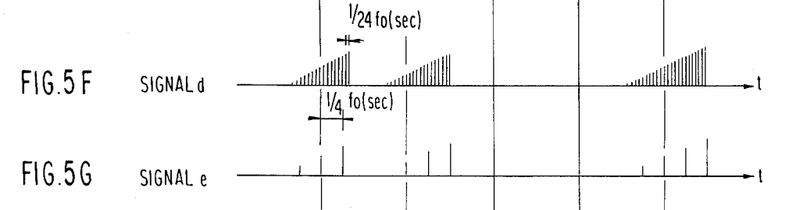

Referring to FIG. 4B, a low-pass filter 44 comprises a comparator 441, a 12-bit counter 442 supplied with an output signal (c') (shown in FIG. 5E) of the comparator 441, and a terminal 444 through which a clock signal (j) (shown in FIG. 5K) is given. The comparator 441 outputs a logic "1" (hereunder abbreviated as "1") signal when the signal (c) is not less than 0 volt, and a logic "0" (hereunder abbreviated as "0") signal when the signal (c) is less than 0 volt. The content of the counter 442 is reset to zero at each rise time of the signal (c'), that is, at each time of changing from "0" to "1". The clock signal (j) having a repetive period of $1/24 f_0$ (sec) is supplied to the counter 442. The content of the counter 442 is incremented by one when the signal (c') is "1" at the rise time of the signal (j), and is produced as a 12-bit binary code (d) ($=d_0 d_1 \ldots d_{11}$), where $d_0$ is a sign bit. FIG. 5F shows the output binary code (d) from the counter 442 in analog form.

Figure 4C:
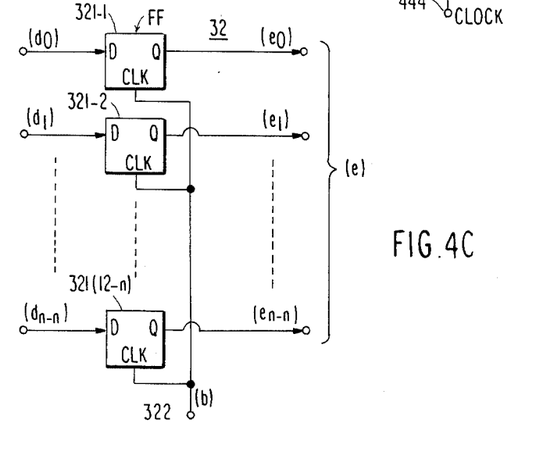
Figures 5H, 5I:
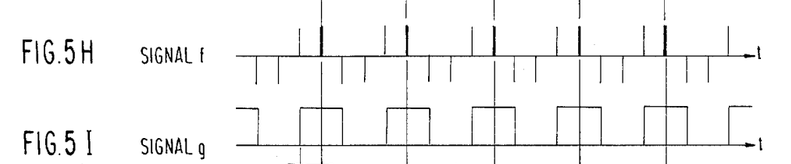
Figure 5J:
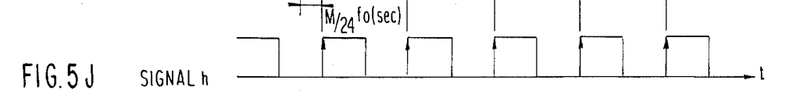
Figure 5K:
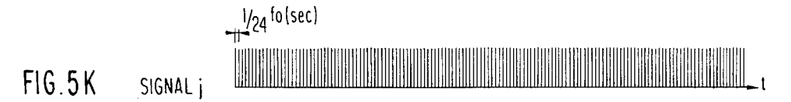
Figure 5L:
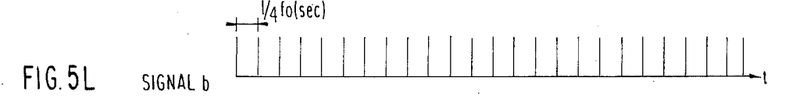

Referring to FIG. 4C, the sampler 32 comprises (12-n) flip-flops 321-1 through 321-(12-n), each of which is given a corresponding one of the high order (12-n) bits ($d_0$ through $d_{11-n}$) of the 12-bit binary code (d), and a terminal 322 given a clock signal (b) (shown in FIG. 5L). The flip-flops 321-1 through 321-(12-n) take the code (d) thereinto at each rise time of the clock signal (b) having a repetitive period of $\frac{1}{4} f_0$ (sec) and outputs it as a (12-n)-bit code (e) where (e) $=(e_0 e_1 \ldots e_{11-n})$. FIG. 5G shows the output binary code (e) of the sampler 32 in analog form.

Figure 4D:
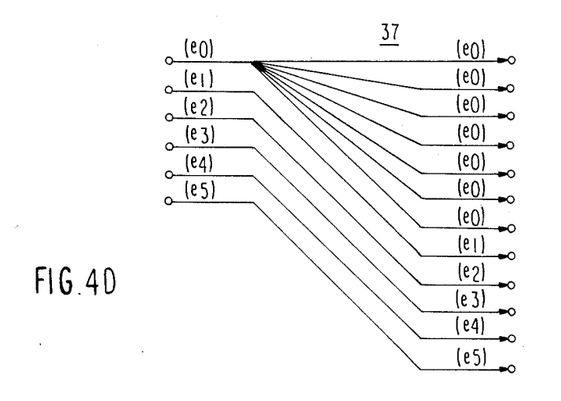

Referring to FIG. 4D showing where the number n of shifts is 6, the shifter 37 is constructed to receive the code (e) $=(e_0 e_1 e_2 e_3 e_4 e_5)$ and output a 12-bit code ($e_0 e_0 e_0 e_0 e_0 e_0 e_0 e_1 e_2 e_3 e_4 e_5$) as the above-mentioned first 12-bit code to the adder 41. Namely, the shifter 37 outputs the code consisting of the code (e) and n bits which are added on the high order side of the code (e). Each of the n bits is equal to the sign bit ($e_0$) of the code (e). The shifter 35, which has the same configuration as that of the shifter 37, outputs the above-mentioned seventh 12-bit code consisting of the high order (12-n) bits of the above-mentioned fifth 12-bit code and n bits which are added on the high order side of the high order (12-n) bits. Each of the n bits is equal to the sign bit of the fifth code.

The shifters 34 and 38 also have similar configuration to the shifter 37, so description of them is omitted.

FIG. 5H shows the output (f) of the filter 33. Since the input signal (i) includes the component of the frequency $f_0$, it is understandable that the filter 33 outputs the signal (f) having the frequency $f_0$. This makes it clear that the circuit shown in FIG. 1 operates as a tank circuit.

Figure 2:
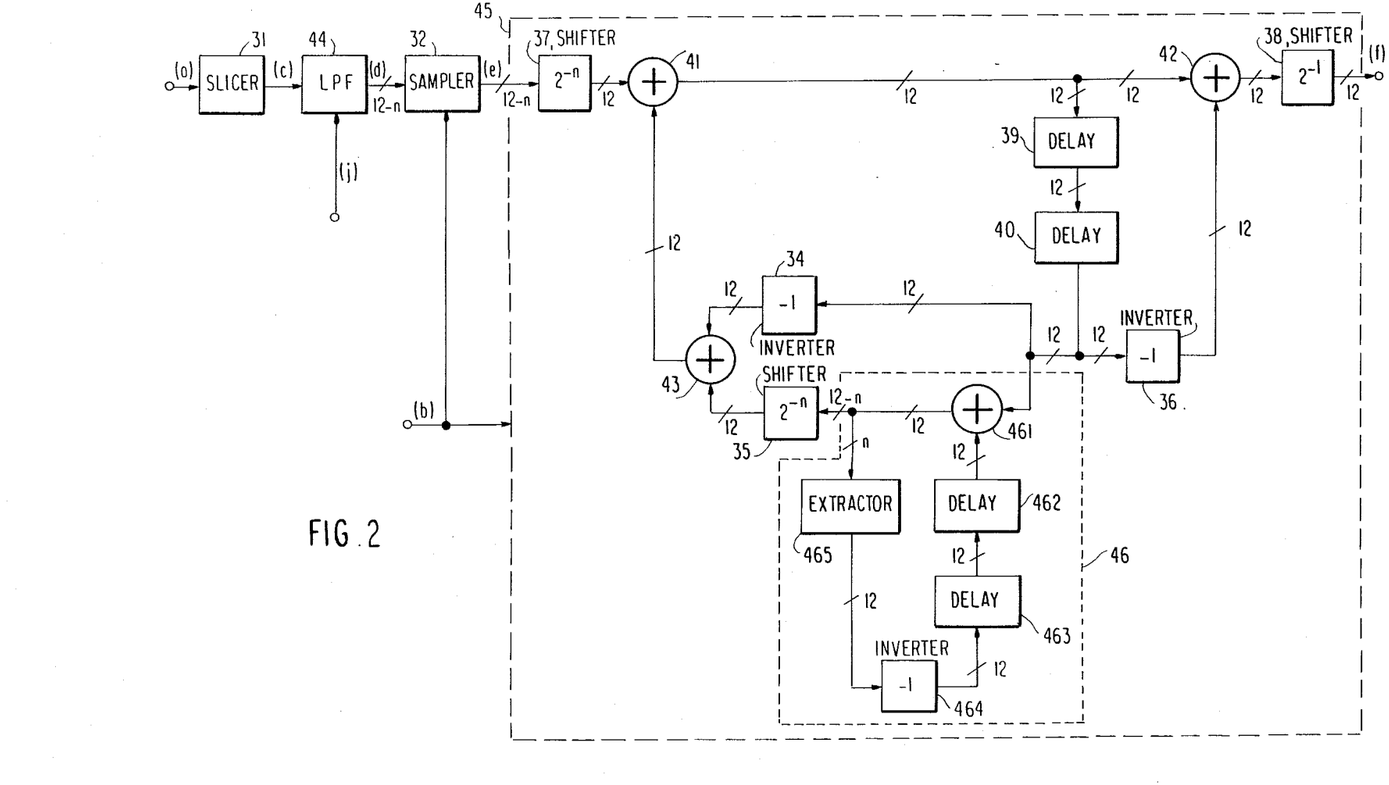
FIG. 2 is a block diagram of a second embodiment of the invention.

Referring to FIG. 2, a second embodiment of the invention comprises a slicer 31, a low-pass filter 44, a sampler 32, and a digital filter 45. The digital filter 45 includes shifters 37, 38 and 35, adders 41, 42 and 43, inverters 34 and 36, delay elements 39 and 40 and a roundoff error canceller 46. The canceller 46 comprises an adder 461 having a first set of 12 input terminals and a second set of 12 input terminals which receives 12-bit code from the delay element 40, an extractor 465, an inverter 464, a delay element 463 and a delay element 462. The adder 461 performs an addition of the codes applied to the first and second sets of 12 terminals to yield a tenth 12-bit code as an input to the shifter 35. The extractor 465 extracts a bit string of the low order n bits from the tenth code and outputs an eleventh 12-bit code which consists of the extracted bit string and (12-n) bits added on the high order side of the extracted bit string. The (12-n) bits assume all "0's". The inverter 464 inverts each bit of the eleventh code to output the inverted code as a twelfth 12-bit code. The delay element 463 outputs the twelfth code as a thirteenth 12-bit code after holding the twelfth code by the time equal to the sampling interval $T_s$. The delay circuit 462 outputs to the second set of input terminal of the adder 461 the thirteenth code as a fourteenth 12-bit code after holding the thirteenth code by the time equal to the sampling interval $T_s$. The canceller 46 functions to cancel the roundoff error produced in the shifter 35. Letting e(t) be an roundoff error, the output of the extractor circuit 465 is expressed as $2^n e(t)$, and then the bits of the output $2^n e(t)$ are inverted by the inverter 464 into $-2^n e(t)$, which is fed to the second set of input terminals of the adder 461 through two delay elements 463 and 462. The transfer function $H_e(z)$ of the error from the output of the shifter 35 to the output of the filter 45 is given by $$H_e(z) = 2^{-1} \frac{(1 + z^{-2})(1 - z^{-2})}{1 + (1 - 2^{-n}) z^{-2}}$$

Accordingly, $$\|H_e\|_\infty = \max_{|z| = 1} |H_e(z)| = 1$$

As apparent from this equation, the output error e(t) of the shifter 35 is not amplified, that is, the amplification of e(t) is at most $\Delta/2$ (where $\Delta = 2^{-b}$, and is is the number of bits having an order than the binary point of the output of the filter 45). Accordingly, the amplitude of the error component included in the output of the filter 45 is about $\Delta/2$.

On the other hand, in the first embodiment without the canceller 46, the output error of the shifter 35 is amplified at most to $2^n$ times, and the amplitude of the error component included in the output of the filter 33 becomes about $2^n \Delta/2$. That is to say, the low order $n+1$ bits of the filter output contain the error without the canceller 46, while only the least significant bit contains the error with the canceller 46.

Figure 6:
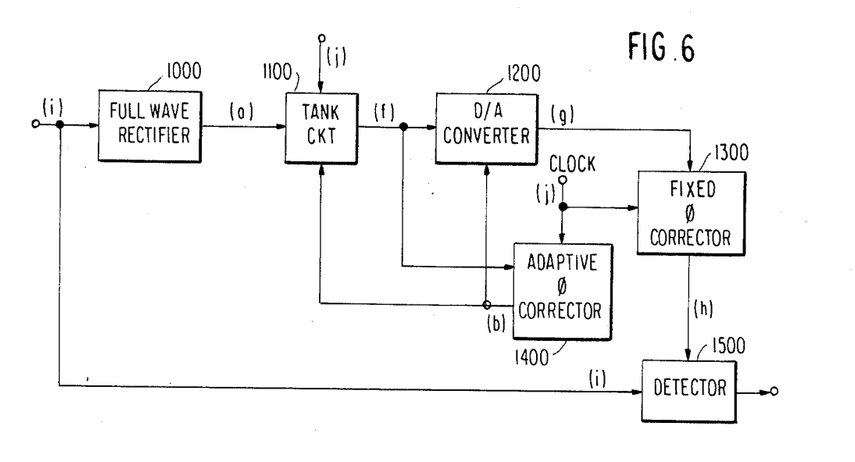
FIG. 6 is a block diagram of a timing extractor.

Referring to FIG. 6, a timing extractor circuit using the tank circuit according to the invention comprises a full-wave rectifier 1000 rectifying the analog input signal (i), a tank circuit 1100 having the same configuration as that of the first or second embodiment, a 1-bit D/A converter 1200, a fixed phase corrector 1300, an adaptive phase corrector 1400, and a sampler 1500. The biopolar input signal (analog input signal) (i) is converted so as to contain as many components of the frequency $f_0$ as possible through the full-wave rectifier 1000, and then supplied to the tank circuit 1100.

The 12-bit output code (f) of the tank circuit 1100 is supplied through the 1-bit D/A converter 1200 to the fixed phase corrector 1300. The corrector 1300 delays the phase of a signal (g), which is supplied from the converter 1200, by several periods of the master clock signal (j) and then outputs the signal (g) as a signal (h). The signal (h) is supplied as a sampling clock signal having the frequency $f_0$ to the sampler 1500. In the sampler 1500, the input analog signal (i) is sampled at each rise time of the sampling clock signal (h), and "0" or "1" of the bipolar signal (input analog signal) (i) is detected.

On the other hand, the output code (f) of the tank circuit 1100 is also supplied to the adaptive phase corrector 1400. The adaptive phase corrector 1400 functions to detect the phase of the output of the tank circuit 1100 according to the below-described method, generate a clock signal (b) of the frequency $f_0 (=4f_s)$ which is obtained by the frequency-division of the master clock signal (j) and whose phase is synchronous with the phase of the output of the circuit 1100, and output the signal (b) to the tank circuit 1100. As described in respect to the first and second embodiments, the tank circuit 1100 operates cosynchronously with these clock signals (b) and (j).

The converter 1200, for example, functions to output only the sign bit of the output code (f) of the tank circuit 1100 as the signal (g) (FIG. 5I).

Figure 7A:
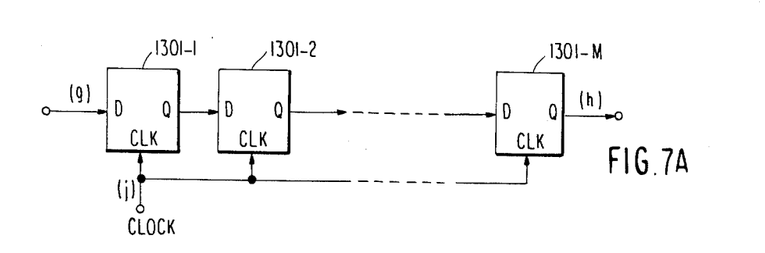
FIGS. 7A and 7B are diagrams for showing main parts of the timing extractor of FIG. 6.

Referring to FIG. 7A, the corrector 1300 consists of M (positive integer) flip-flops 1301-1 through 1301-M interconnected in cascade. To the first flip-flop 1301-1, the output signal (g) of the converter 1200 is applied. Each flip-flop takes the output of the preceding flip-flop therein in synchronism with the clock signal (j). The output signal (h) of the last flip-flop 1301-M is shown in FIG. 5J. As understood from the comparison of FIGS. 5I and 5J, the signal (h) is delayed from signal g by $M/24f_0$ (sec).

Figure 7B:
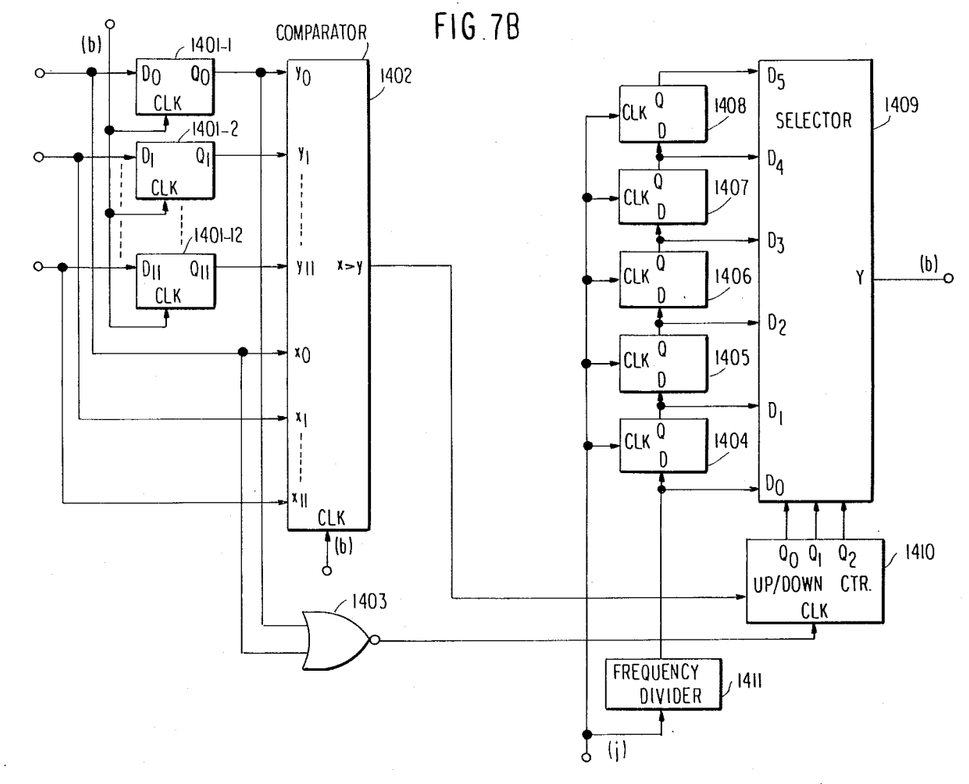

Referring to FIG. 7B, the circuit 1400 comprises a group of 12 flip-flops 1401-1 through 1401-12 corresponding to individual bits of the 12-bit code (f); a comparator 1402 which compares a 12-bit code $(x_0 x_1 \ldots x_{11})$ incoming to the group of flip-flops 1401-1 through 1401-12 with another 12-bit code $(y_0 y_1 \ldots y_{11})$ produced from them, and output "1" only when the code $(x_0 x_1 \ldots x_{11})$ is greater than the code $(y_0 y_1 \ldots y_{11})$; a NOR gate 1403 which performs a NOR operation of the sign bit of the code (f) given to the flip-flop 1401 and the sign bit produced from the flip-flop 1401; an octal up-down counter 1410 whose content is incremented by one when the output of the comparator 1402 at the rise time of the output signal of the gate 1403 is "1" and decremented by one when it is "0"; a frequency-divider 1411 responsive to the clock signal (j) for producing a divided signal whose frequency is equal to 1/6 times frequency of the clock signal (j); a group of five flip-flops 1404 through 1408 which operates in synchronism with the clock signal (j); and a selector 1409 which receives outputs of the flip-flops 1404 through 1408 at input terminals ($D_1$ through $D_5$), respectively, and a output of the divider 1411 at a input terminal $D_0$. To an input terminal D of the flip-flop 1404, the output of the divider 1411 is applied.

Figure 7C:
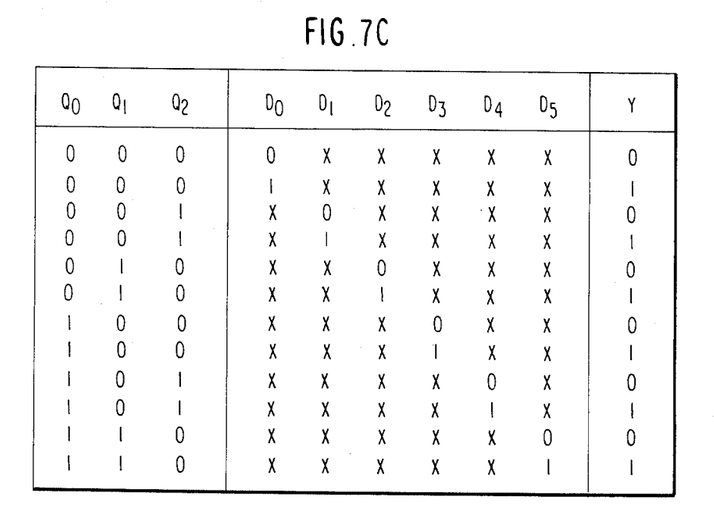
FIG. 7C shows a truth table illustrating an operation of a selector.

FIG. 7C is a truth table illustrating an operation of the selector 1409. $Q_0$, $Q_1$ and $Q_2$ represent a 3-bit signal fed from the counter 1410, $D_1$, $D_2$, $D_3$, $D_4$ and $D_5$ are signals fed from the flip-flops 1404, 1405, 1406, 1407 and 1408, respectively, and Y is an output signal (b) of the selector 1409.

While the invention has been described in conjunction with the embodiment thereof, it will now readily be possible for those skilled in the art to put the invention into practice in various other manners.

What is claimed is:

1. A digital tank circuit having a center frequency $f_0$, comprising:

sampling means for sampling an input signal at a predetermined sampling interval of $T_s$ equal to $\frac{1}{4} f_0$ and converting sampled values into corresponding predetermined binary codes each consisting of a predetermined number of bits; and filter means responsive to each said binary code for providing a transfer function represented by $$H(z) = 2l \frac{1 - z^{-2}}{[1 + (1 - 2^{-n}) z^{-2}]}$$

where l is an integer, wherein said filter means comprises:

first shift means responsive to each said binary code for outputting a third bit string whose high order side consists of a first bit string of k (positive integer) bits, each having the same value as the sign bit of said binary code, and whose low order side consists of a second bit string identical to the m high order (positive integer) bits of said binary code;

first addition means responsive to said third bit string fed from said first shift means as first input data for producing first addition data obtained by adding the first input data and a second input data;

first delay means through which said first addition data passes after being delayed by a time of $2T_s$;

first inversion means for inverting said first addition data fed from said first delay means to produce first inverted data;

second shift means for outputting a sixth bit string whose high order side consists of a fourth bit string consisting of n bits, each having the same value as the sign bit of said first addition data passing through said first delay means, and whose low order side consists of a fifth bit string identical to the m high order bits of said first addition data;

second addition means for supplying second addition data, obtained by adding said first inverted data and said sixth bit string, to said first addition means as said second input data;

second inversion means for inverting said first addition data passing through said first delay means bit by bit to produce second inverted data;

third addition means for producing third addition data obtained by adding said first addition data and said second inverted data; and third shift means for producing data including a seventh bit string obtained by shifting said third addition data by (l+k) bits to the left as a filer output.

2. A digital tank circuit claimed in claim 1, further comprising error cancellation means connected between said first delay means and said second shift means to cancel a roundoff error generated in said filter means.

3. A digital tank circuit claimed in claim 2, wherein said error cancellation means includes:

fourth addition means responsive to said first addition data fed from said first delay means as first input data for producing fourth addition data obtained by adding the first input data and a second input data to said second shift means;

extracting means for extracting low order n bits from said fourth addition data;

third inversion means for inverting the low order n bits of said fourth addition data to produce third inverted data; and second delay means through which said third inverted data is supplied to said fourth addition means as said second input data after being delayed by a time of $2T_s$.

* * * * *